US006630382B1

(12) United States Patent
Thornton (10) Patent No.: US 6,630,382 B1
(45) Date of Patent: Oct. 7, 2003

(54) CURRENT CONTROLLED FIELD EFFECT TRANSISTOR

(75) Inventor: Trevor J. Thornton, Fountain Hills, AZ (US)

(73) Assignee: Arizona State University, Tempe, AZ (US)

( * ) Notice: Subject to any disclaimer, the term of this patent is extended or adjusted under 35 U.S.C. 154(b) by 38 days.

(21) Appl. No.: 10/018,439

(22) PCT Filed: May 31, 2000

(86) PCT No.: PCT/US00/15066

§ 371 (c)(1),
(2), (4) Date: Nov. 30, 2001

(87) PCT Pub. No.: WO00/74144

PCT Pub. Date: Dec. 7, 2000

Related U.S. Application Data (60) Provisional application No. 60/137,077, filed on Jun. 2, 1999.

(51) Int. Cl.[7] .............................................. H01L 21/336
(52) U.S. Cl. ....................... 438/263; 257/200; 257/321; 257/318; 257/345

(58) Field of Search ................................. 257/200, 321, 257/318, 328, 368, 350, 347, 345; 438/263, 264, 594, 282

(56) References Cited

U.S. PATENT DOCUMENTS 5,493,141 A * 2/1996 Ricco et al. .................. 257/321
5,552,330 A * 9/1996 Tehrani et al. ............... 438/172

FOREIGN PATENT DOCUMENTS

| JP | 04290474 A | * | 10/1992 | ......... H01L/29/784 |
| JP | 06236998 A | * | 8/1994 | ......... H01L/29/784 |

* cited by examiner

Primary Examiner—Long Pham
Assistant Examiner—Nathan W. Ha
(74) Attorney, Agent, or Firm—Ingrassia Fisher & Lorenz (57) ABSTRACT

Various emdodiments include a transistor device that is controlled by a gate current and that exhibits low power consumption as well as high speed characteristics. In various embodiments, an enhancement mode MESFET device exhibits channel drain current that is controlled by the application of bias current into the gate. Complementary n- and p-channel devices can be realized for, for example, micropower analog and digital circuit applications.

15 Claims, 10 Drawing Sheets

MOSFET (CMOS)

$V_s=0$, $V_{gs}>V_{th}\approx 0.7\,V$, $I_g\approx 0$, $V_{ds}>V_{gs}-V_{th}$ $I_d \propto (V_{gs}-V_{th})^2$ STRONG INVERSION REGIME
$V_{gs}>V_{th}$

PRIOR ART
FIG.1a

MOSFET (CMOS)

$V_s=0$, $0.1<V_{gs}<0.6\,V$, $I_g\approx 0$, $V_{ds}>0$

WEAK INVERSION REGIME
$V_{gs}<V_{th}$

PRIOR ART
FIG.1b

BJT $V_{be}\approx 0.7\,V$
$I_b \propto \exp(eV_{be}/kT)$ $V_e=0$    E n-Si | B p-Si | C n-Si    $V_{cb}>0$
$I_c \approx \beta I_b$

PRIOR ART
FIG.1c

DEPLETION MODE MESFET $V_s=0$, $V_{gs}<0\,V$, $I_g=I_s$, $V_{ds}>0$

$I_d \propto (V_{gs}-V_{th})^{3/2}$

PRIOR ART
FIG.1d

PRIOR ART

CURRENT CONTROLLED FIELD EFFECT TRANSISTOR

STATEMENT OF RELATED APPLICATIONS

This Application claims priority of Patent Cooperation Treaty (PCT) Application PCT/US00/15066 filed May 31, 2000, which in turn claims priority of U.S. Provisional Application Ser. No. 60/137,077 filed Jun. 2, 1999.

FIELD OF THE INVENTION

The invention generally relates to electronic devices such as transistors. Various aspects of the present invention include methods and devices relating to field effect transistors that may be controlled by gate currents.

BACKGROUND OF THE INVENTION

Electronic devices such as diodes, transistors and the like are commonly used in many items found in homes, offices, vehicles, personal electronics, industrial and aerospace applications, medical devices and elsewhere. Generally speaking, a transistor is a three-terminal device that provides, for example, amplification or switching capabilities in analog and digital circuits. Recently, efforts have been focused upon creating transistors that perform various functions with reduced power consumption. Reduced power consumption is particularly desirable in applications that require batteries that may need to be replaced when power is expended. In medical devices (such as pacemakers), satellite devices, and other applications, battery replacement can be extremely inconvenient, so the need for so-called "micropower" components is increased. In addition, low power devices are typically preferred for ultra-large-scale-integration (ULSI) circuits, which frequently require low power devices to minimize total power dissipation.

Various forms of transistors are shown in FIG. 1. Such transistors generally fall into one of two categories corresponding to field effect transistors (FETs) and bipolar junction transistors (BJTs). Generally speaking, FETs operate in response to a voltage applied at a gate terminal that suitably controls a depletion region that affects current flow in a semiconducting channel. BJTs are typically characterized by a joining of two P-N junctions, as best seen in FIG. 1(c).

Figure 1A:
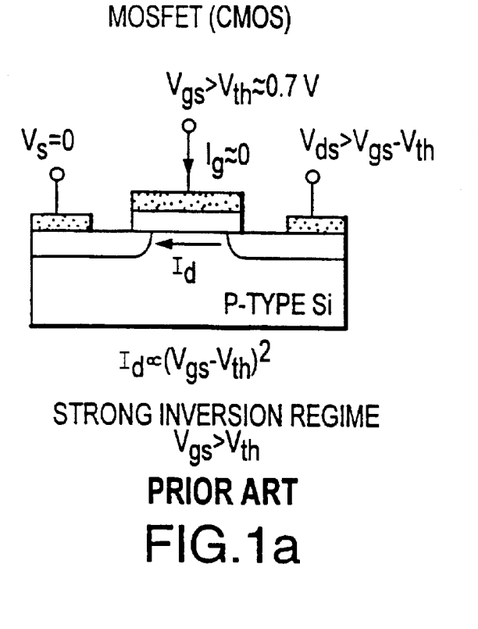
FIG. 1a is a schematic representation of a MOSFET operated in the strong inversion regime.

Presently, the majority of "standard" transistor devices used in microprocessor and other digital applications are complementary metal oxide semiconductor FETs (CMOS) operating in a strong inversion regime where input voltage, $V_{gs}$, is greater than a threshold voltage $V_{th}$. In such transistors the current flowing in a semiconducting channel (drain current, $I_d$) typically varies as $(V_{gs}-V_{th})^2$. $V_{th}$ for such devices may be around 0.7 V and current flow in the channel may be in the milli-amp range. A biasing configuration of an exemplary strongly inverted n-channel prior art MOSFET device is shown by FIG. 1(a).

Figure 1B:
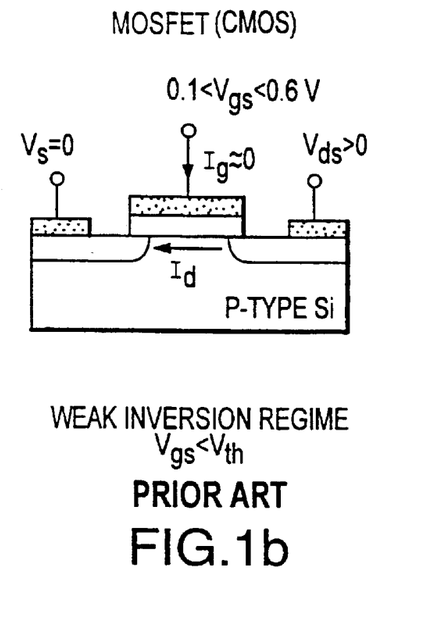
FIG. 1b is a schematic representation of a MOSFET operated in the weak inversion regime.

For applications requiring minimal current flow, CMOS based circuits may be biased as so-called "sub-threshold MOSFETs" operating in a weak inversion regime where gate-source voltage $V_{gs}$ is less than $V_{th}$. FIG. 1(b) shows exemplary biasing conditions for a weakly inverted n-channel MOSFET. Under these conditions the MOSFET drain current, $I_d$, typically varies in the picoamp to microamp range and is given by $$I_d = \frac{\mu C_{OX} W}{L} e^{(V_{gs}-V_{th})/U_T}(1-e^{-V_{ds}/U_T}) \qquad (1)$$

where $U_T=kT/e$, which may be about 25.8 mV at room temperature, $\mu$ is the carrier mobility, $C_{ox}$ is the oxide capacitance and W/L is the width-to-length ratio of the transistor.

The low drain currents and small voltage required for drain current saturation (e.g. $V_d^{sat} \geq 3U_T \sim 75$ mV) of devices operating in the weak inversion regime makes sub-threshold operation ideal for micropower circuit applications such as pocket calculators, pagers, medical implants, ULSI logic etc.. The main disadvantage of such devices, however, is low speed. Cut-off frequency in the weak inversion regime is typically given by $f_T=\mu U_T/2\pi L_g^2$. For a weakly inverted NMOS device $\mu$ is on the order of 200 cm²/Vs and for $L_g=3$ $\mu$m, creating an operating frequency of about 9 MHz, although stable operation generally takes place at much lower frequencies (e.g. on the order of about 200–500 kHz).

A distinction between transistors operating in the weak inversion or weak accumulation regime (as opposed to the strong inversion or strong accumulation regime) is that the drain current in the weak inversion or weak accumulation operating regime typically varies exponentially with the difference between the gate-source voltage and the threshold voltage (e.g. $V_{gs}-V_{th}$). Small variations in $V_{th}$ therefore typically produce large variations in $I_d$ because of the exponential nature of equation 1. Attempting to improve the speed $f_T$ of micropower devices by reducing gate length $L_g$, then, is not typically practical because of difficulties in precisely matching threshold voltages $V_{th}$ between devices. For this reason many micropower circuits typically have undesirably long gates (e.g. $L_g \geq 1$ $\mu$m) and typically operate below 1 MHz.

Figure 1C:
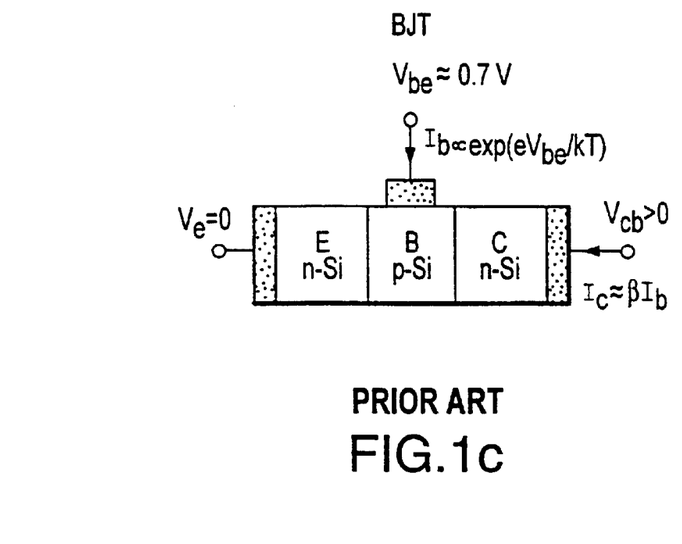
FIG. 1c is a schematic representation of a BJT.

Controlling a transistor with an input bias current has been used with various BJT devices wherein collector current $I_c$ may be expressed as $\exp(V_{be}/U_T)$. It is generally impractical to use base-emitter voltage, $V_{be}$, to control $I_c$ due to the exponential dependency of current ($I_c$) on base-emitter voltage ($V_{be}$). Rather than using base-emitter voltage, many BJTs use input base current, $I_b$, to control $I_c$ via the current gain $\beta$, i.e. $I_c=\beta I_b$. Such control via current bias configuration for an exemplary NPN BJT is shown in FIG. 1(c).

In principal, prior art BJT devices could be used in the micropower regime by applying a sufficiently small base current to ensure that $I_c$ is in the picoamp to microamp range. However, because BJTs are generally minority carrier devices, charging the input diffusion capacitance (i.e. $C_{diff}$ of the forward biased base-emitter junction) takes an undesirable amount of time, thus causing the cut-off frequency to be undesirably small. BJTs typically are not used as a micropower device at high frequencies.

An alternate prior art transistor configuration is the metal-semiconductor FET or MESFET. MESFETs are typically used as depletion mode devices (i.e. the channel is conducting for $V_{gs}=0$) and may be switched off by applying a reverse bias voltage to the Schottky gate input. To make this kind of depletion mode MESFET, the active channel layer is generally relatively thick and relatively heavily doped such that the depletion region under the gate is smaller than the channel thickness for $V_{gs}=0$. A typical biasing configuration for an n-channel MESFET is shown in FIG. 1d.

Figure 1D:
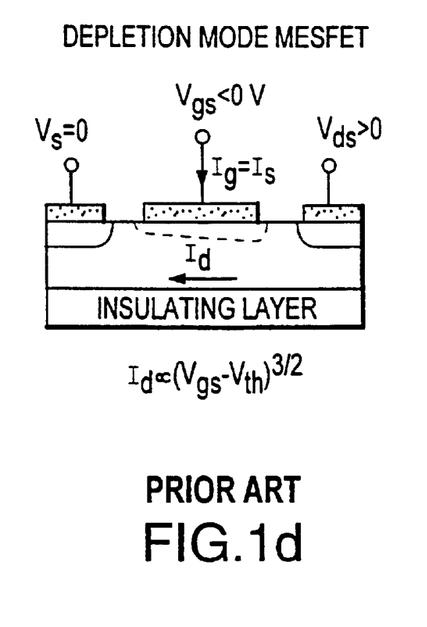
FIG. 1d is a schematic representation of a depletion mode MESFET.

Referring to FIG. 1d, for an n-channel depletion mode MESFET, the threshold voltage $V_{th}$ is typically less than zero and the gate voltage is varied in the range $V_{th}<V_{gs}<0$ to control the drain current, which varies as some small power of the difference between the gate-source voltage and the threshold voltage (e.g. $V_{gs}-V_{th}$). In this configuration the current flowing into the gate is that due to a reverse-biased Schottky junction. In many devices, the gate current is designed to be negligibly small compared to the drain current. The gate current typically plays no role in the control of the drain current other than to establish the gate voltage. Stated another way, gate current in such MESFETs is typically a mere 'leakage' current that is generally intended to be kept to the lowest possible levels.

Figure 2:
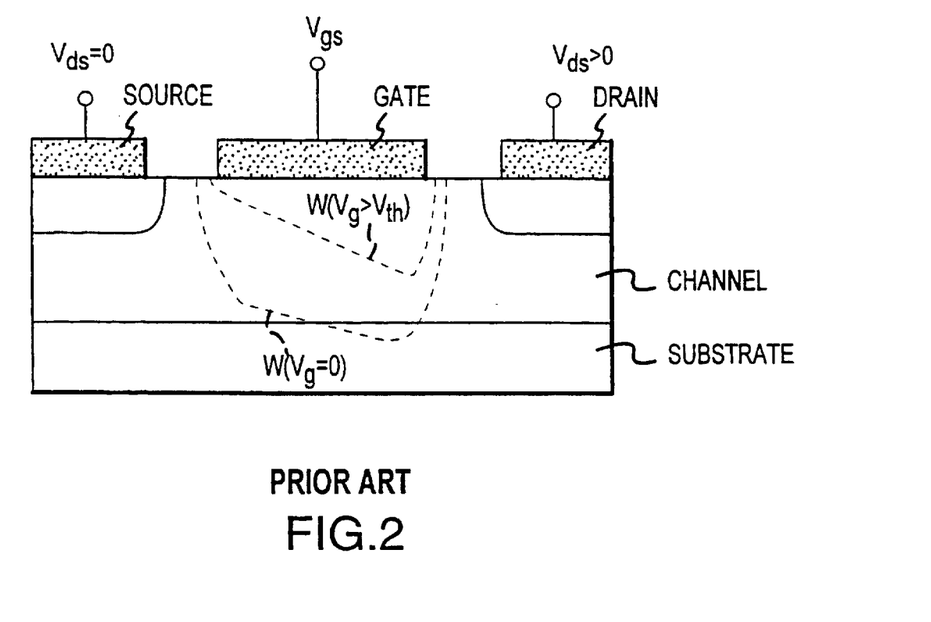
FIG. 2 is a schematic representation of a prior art enhancement mode MESFET.

Enhancement-mode MESFETs have also been created such that the depletion region extends across the active channel layer at $V_{gs}=0$ as shown in FIG. 2. The transistor is switched on by applying a forward bias voltage to the gate such that the depletion region extends across only a part of the semiconducting channel. The voltage applied to the gate, however, typically has to be kept low enough such that the gate input current is much less than the drain current. Once again, the gate current typically plays no role in the control of the drain current other than to establish a gate voltage. As such, drain current $I_d$ is controlled by the gate voltage and varies as some small power of $(V_{gs}-V_{th})$. In this configuration the transistor is generally considered to be conducting when the gate-source voltage is greater than the threshold voltage (i.e. when $V_{gs}>V_{th}$). When enhancement-mode MESFETs are switched on, these devices typically operate in the regime of strong accumulation (analogous to strong inversion in a MOSFET) and drain current is typically in the milliamp range. This level of current is generally highly undesirable for micropower applications because of the associated high power consumption. Generally, it is desirable that micropower devices have drain currents in the micro- to picoamp range.

An important difference between the MOSFET and MESFET is the presence of an insulating layer between the gate (input) electrode and the conducting channel of a MOSFET. Without the gate insulator the semiconductor surface cannot be inverted and the MOSFET drain current is negligible. The insulator must be thick enough that no current can leak from the gate to the channel. As the gate length of the MOSFET is reduced to smaller geometries, however, the thickness of the insulating gate oxide is reduced proportionally. For very thin gate insulators excessive currents can flow from the gate, through the insulator, to the channel. This gate leakage current is expected to limit the minimum allowable gate insulator thickness, which in turn will limit the minimum gate length of the MOSFET. In contrast the MESFET does not require a gate insulator. Consequently, it is expected that MESFETs may be scalable to smaller dimensions than MOSFETs.

DESCRIPTION OF VARIOUS EMBODIMENTS OF THE INVENTION

Overview

According to various aspects of the invention, an enhancement mode MESFET is produced whereby channel drain current is controlled by the application of a bias current into, or out of, the gate electrode of the MESFET. By carefully selecting channel doping, $N_D$, channel thickness, a, and gate length, L, current gain greater than 1 (e.g. $\beta>1$) can be achieved for devices manufactured in accordance to the methods described below. For example, gate current control of drain current described by the present invention may be made analogous to base current control of collector current in BJTs. It is therefore appropriate that devices made in accordance with the present invention be considered as Schottky Junction Transistors (SJTs). Because the SJT is a majority carrier device, however, it may not suffer from the same minority carrier problems as the BJT. Specifically, various embodiments of the SJT will not typically exhibit the diffusion capacitance created by minority carriers in BJTs, since SJTs do do not typically depend on minority carriers for their operation. As a result, the input capacitance of the SJT gate electrode may be orders of magnitude smaller than the input capacitance of a BJT, thus allowing the SJT to operate at much higher frequencies in the micropower regime.

In various embodiments, both input gate current and output drain current of the SJT may be made to vary exponentially with the applied gate bias by selecting appropriate layer thickness and doping concentrations, making the ratio of gate current to drain current (e.g. the gain of the device) relatively independent of threshold voltage. By removing the effects of threshold voltage on the drain-current-to-gate-current ratio, transistor matching in the subthreshold regime is improved and device gate lengths can be made substantially shorter thus allowing for transistor operation at significantly higher frequencies. Additionally, various SJT devices have been found to be particularly suitable for drain currents in the range applicable to micropower circuit applications (i.e. picoamps to microamps). Moreover, digital circuit applications can be realized using complementary n- and p-channel devices as taught by the present invention. Micropower analog and digital circuits made from SJTs may therefore be capable of operating at higher frequencies than those made using conventional devices such as weakly inverted MOSFETs.

An additional advantage of various embodiments of the SJT is that circuits made using complementary versions of the device suitably take up less area than prior art MOSFET circuits. The reduction in area occurs for two reasons. First, the device does not typically require an insulator between gate and channel, so the gate lengths of both n- and p-channel devices can be made smaller than those in conventional MOSFETs. Secondly, the complementary n- and p-channel SJTs may be made with conducting channels of the same or similar width. In conventional CMOS circuits, p-channel devices may be approximately twice as wide as n-channel devices. Digital circuits made from complementary version of the new device may therefore be able to achieve higher integration levels than conventional CMOS because of (i) the reduction in width of the p-channel device and (ii) the ability to scale the gate length to smaller dimensions. Other advantages associated with the lack of a gate insulator in the current invention are (i) reduced input (gate) capacitance and (ii) reduced manufacturing complexity.

Analytical Basis

The analytical basis of various exemplary embodiments may be summarized by equation (2) below.

$$\beta = \frac{I_d}{I_g} = \frac{\varepsilon k^2 \mu}{aL^2 q^2 A^*} \frac{N_c}{N_D} \exp\left(\frac{qN_D a^2}{2\varepsilon U_T}\right) \quad (2)$$

In deriving equasion 2, it is useful to first consider an enhancement mode n-type GaAs MESFET for which the gate current is given by:

$$I_g = WLA^* T^2 e^{-\phi_b/U_t}(e^{V_g/U_T} - 1) \quad (3)$$

where W, L are the channel width and length, $\phi_b$ is the Schottky barrier height and A* is the Richardson constant. If the MESFET is weakly accumulated, the drain current may be written as:

$$I_d = \alpha \frac{N_+}{N_D a} \frac{W}{L} \varepsilon U_T^2 \mu \left[\exp\left(\frac{V_{gs} - V_{th}}{U_T}\right)\right]\left(1 - e^{-\frac{V_{ds}}{U_T}}\right) \quad (4)$$

where
1<α<2
$N_+$=source and drain contact doping concentrations
$N_D$=channel doping concentration
a=channel thickness
Assuming $\alpha N_+/N_D=1$ and taking $V_{ds}>3U_T$ gives $$I_d \cong \frac{W \varepsilon \mu}{aL} U_T^2 \exp\left(\frac{V_{gs} - V_{th}}{U_T}\right) \quad (5)$$

$$I_g \cong WLA^* T^2 e^{-\phi_b/U_T} e^{V_{gs}/U_T} \quad (6)$$

Taking the ratio of equations (5) and (6) gives the current gain of the device $$\frac{I_d}{I_g} = \frac{\varepsilon k^2 \mu}{aL^2 q^2 A^*} e^{(\phi_b - V_{th})/U_T} \quad (7)$$

Figure 3:
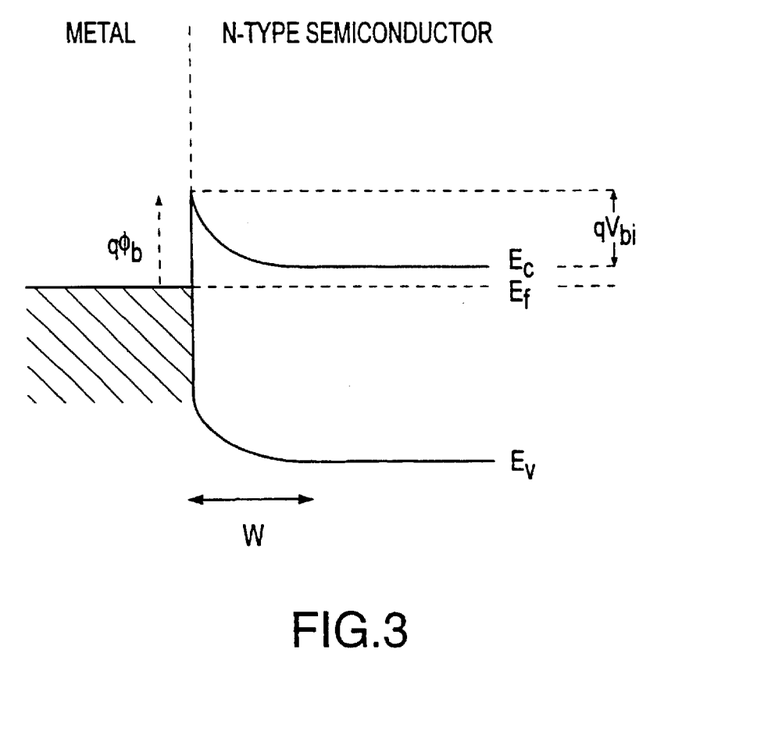
FIG. 3 is a schematic representation of a Schottky junction formed on an n-type semiconductor.

FIG. 3 is an energy-band diagram of an exemplary metal to n-type semiconductor Schottky junction. The diagram shows the relationship between the Schottky barrier height, $\phi_b$, the built-in voltage, $V_{bi}$ and the extent of depletion region, W. Built-in voltage is the potential difference that forms between the Schottky gate and the semiconducting channel (see below) as a result of the Schottky barrier. From FIG. 3 it can be seen that the Schottky barrier height and the built-in voltage may be related by:

$$q\phi_b = qV_{bi} + (E_C - E_F). \quad (8)$$

From standard texts it can be shown that:

$$(E_C - E_F) = kT \ln\left(\frac{N_C}{N_D}\right) \quad (9)$$

and $$V_{bi} = V_{th} + \frac{qN_D a^2}{2\varepsilon}. \quad (10)$$

From equations (8), (9) and (10) it can be shown that:

$$\phi_b - V_{th} = U_T \ln\left(\frac{N_c}{N_D}\right) + \frac{qN_D a^2}{2\varepsilon}$$

and substituting this term into eq. (7) gives $$\frac{I_d}{I_g} = \frac{\varepsilon k^2 \mu}{aL^2 q^2 A^*} \frac{N_c}{N_D} \exp\left(\frac{qN_D a^2}{2\varepsilon U_T}\right) \quad (11)$$

It will be appreciated that equation 11 may be expressed as a constant term multiplied by an exponentiated constant term. Hence, by using a gate current to bias the sub-threshold FET, the terms in $V_{gs}-V_{th}$ (which lead to drain current variations) have been cancelled, and the drain current fluctuates in response to variations in doping and channel thickness; thus, the fluctuations in threshold voltage may be substantially removed from the problem. As a result, transistor matching may be made significantly easier, and circuits using FETs with shorter gate lengths may be created, thus allowing significantly faster operating frequencies than voltage-controlled devices.

As an example, consider an exemplary GaAs MESFET with a 5 μm gate length, and a=80 nm, $N_D=10^{17}$ cm$^{-3}$ and $\phi_b$=0.8 V. Using these values and ordinary approximations, the threshold voltage may be estimated to be $V_{th}$=0.31 V and equation 8 gives a current gain of about 29, which may actually be underestimated.

Exemplary Embodiment

Figure 4:
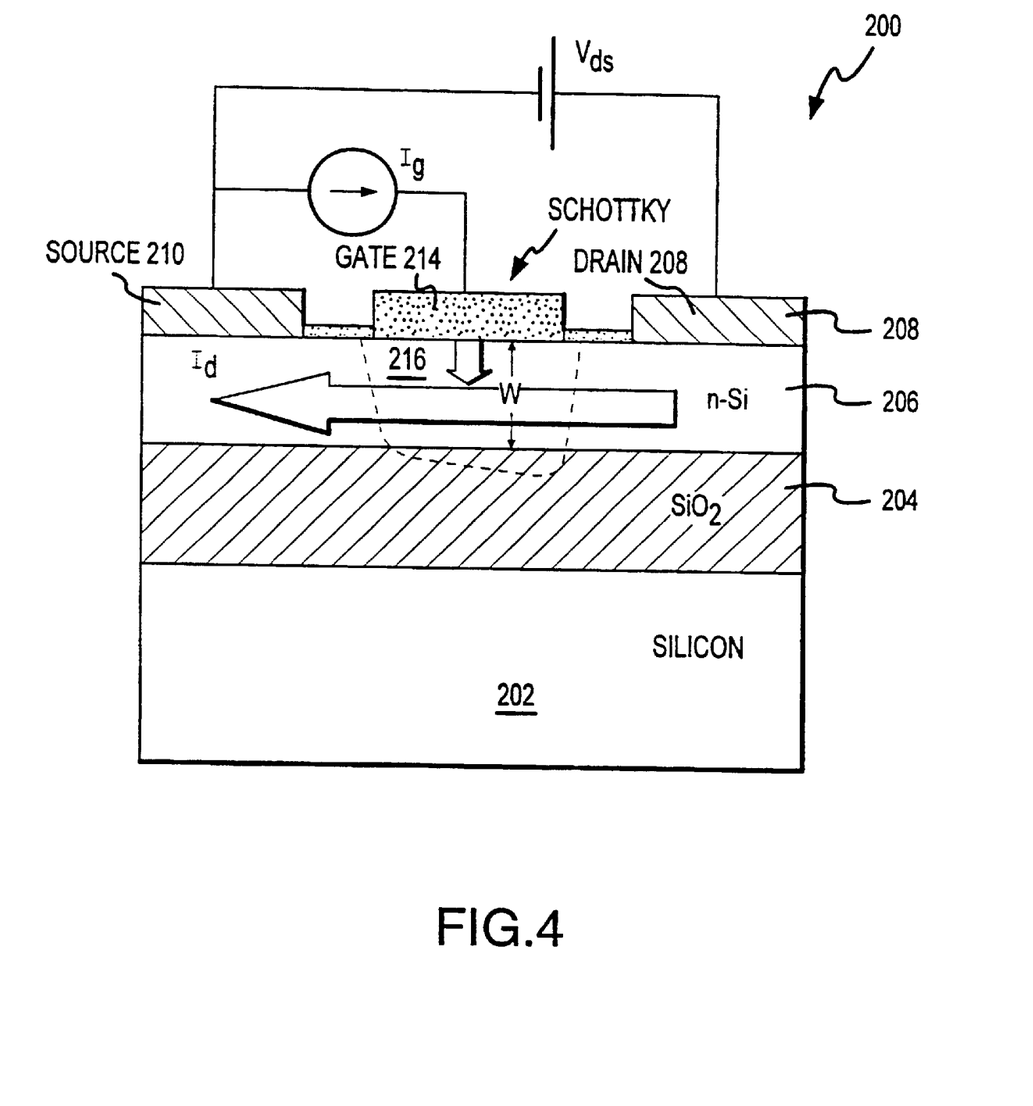
FIG. 4 is a schematic representation of an exemplary Schottky Junction Transistor (SJT) as disclosed by the present invention.

FIG. 4 is a cross-sectional view of an exemplary Schottky junction transistor 200. According to various embodiments and with reference now to FIG. 4, an exemplary SJT 200 suitably includes an optional insulating layer 204 placed on a substrate 202. A semiconducting channel 206 is placed on insulating layer 204 (or substrate 202 in alternate embodiments). Source terminal 210, gate terminal 214 and drain terminal 208 are formed on channel 206 as appropriate SJTs could be fabricated with any technology such as gallium arsenide, silicon, silicon-on-insulator (SOI), or the like. SOI generally allows insulating layer 204 directly under channel 206, which may reduce substrate leakage effects. SOI is also compatible with mainstream silicon process technology. Substrate 202 may be a silicon substrate as shown in FIG. 4, or any other substrate material such as gallium arsenide, gallium nitride, poly-crystalline silicon, amorphous silicon, silicon dioxide (glass) or the like could be used. Insulating layer 204 may be deposited, sputtered, or otherwise placed on substrate 202 and may be formed of buried silicon dioxide (as shown in FIG. 4) or any other suitable insulating material such as silicon nitride. Conventional SOI technology is capable of producing buried oxides with thicknesses in the range 0.05 to 0.4 microns, although other thicknesses may also be used. Other techniques such as wafer bonding, for example, are capable of producing buried oxides thicker than 10 microns or more. The thickness of insulating layer 204 will vary from embodiment to embodiment, but may be on the order of 0.2–0.5 microns, such as about 0.35 microns.

Semiconducting channel 206 may be sputtered, deposited, grown or otherwise formed on insulating layer 204 as appropriate. In the embodiment shown in FIG. 4, channel 206 is shown as n-type silicon for the n-channel devices, although p-type silicon would be used for the p-channel devices. Alternatively, any other semiconducting material such as GaAs, GaN, poly-crystalline silicon, amorphous silicon etc. could be used. Conventional SOI technology is capable of producing silicon surface layers with a thicknesses in the range 0.01 to 0.2 microns or so. Other existing techniques such as wafer bonding, for example, may be capable of producing silicon surface layers that are thicker than 1.0 or more microns. In an exemplary embodiment, channel 206 is formed of a silicon layer having thickness a=0.05 $\mu$m that has been doped n-type to a concentration $N_D=10^{17}$ cm$^{-3}$, although of course other materials, dopants and dopant concentrations may be used in other embodiments.

In various embodiments, gate terminal 214 (also called a "gate electrode" or simply "gate") is fashioned on channel 206 as a Schottky junction according to any technique. Gate terminal may be formed of cobalt di-silicide (CoSi$_2$), aluminum, platinum or any other material that forms a Schottky barrier when deposited on semiconducting channel 206. Cobalt di-silicide, for example, has been shown to form almost ideal Schottky diodes to n-type silicon and is compatible with silicon processing. In various embodiments, current technology would allow the fabrication of gate lengths that may vary from about 0.01 microns to about 5 microns or more (such as about 0.5 microns), although of course dimensions will vary from embodiment to embodiment. Source terminal 210 (also called "source") and drain terminal 208 (also called "drain") may be fashioned on channel 206 in any manner, and may be formed of any conducting material such as aluminum, copper, gold, silver or any other metal or silicide that forms a low resistance, ohmic contact to the semiconducting channel. To aid the formation of low resistance ohmic contacts the semiconducting channel beneath the contact regions (212) may be heavily implanted with dopant atoms. For n-channel silicon devices these dopants may be arsenic or phosphorus or any other material that forms an n-type region to the semiconducting channel 206. For p-channel silicon devices the dopants may be boron or any other material that forms a p-type region to the semiconducting channel. The distance between source and drain varies from embodiment to embodiment, but using current technologies and design rules this distance may be about 0.03 microns to about 10 microns, such as about 0.9 microns in an exemplary embodiment. The surface of channel 206 between the various terminals may optionally be covered with a protective layer 220 of silicon dioxide (SiO$_2$) or any other material.

In various embodiments, the dopants and concentration of dopants in channel 206 are selected such that a depletion region 216 is formed near gate 214 that effectively closes (or nearly closes) current flow 218 from drain 208 to source 210 when zero bias voltage $V_{ds}$ is applied. If a positive bias voltage $V_{ds}$ is applied between the drain and source terminals, the magnitude of drain current 218 flowing in channel becomes dependent upon the gate current $I_g$ applied at gate terminal 214, which is a Schottky junction. By varying the gate current $I_g$, the drain current $I_d$ may be suitably adjusted and controlled without regard to threshold voltage, as shown by the "Analytical Basis" section above.

The depletion region may be formed by the presence of the Schottky contact above the semiconducting channel. The depletion region extends a vertical distance, W, below the Schottky contact into the semiconducting channel. In various embodiments, the depletion region is a consequence of the band bending that occurs in the conduction band and valence band of a semiconducting material placed in contact with another material that forms a Schottky contact to said semiconducting material. The distance W may be determined in accordance with Equation 12, as described below.

Figure 5:
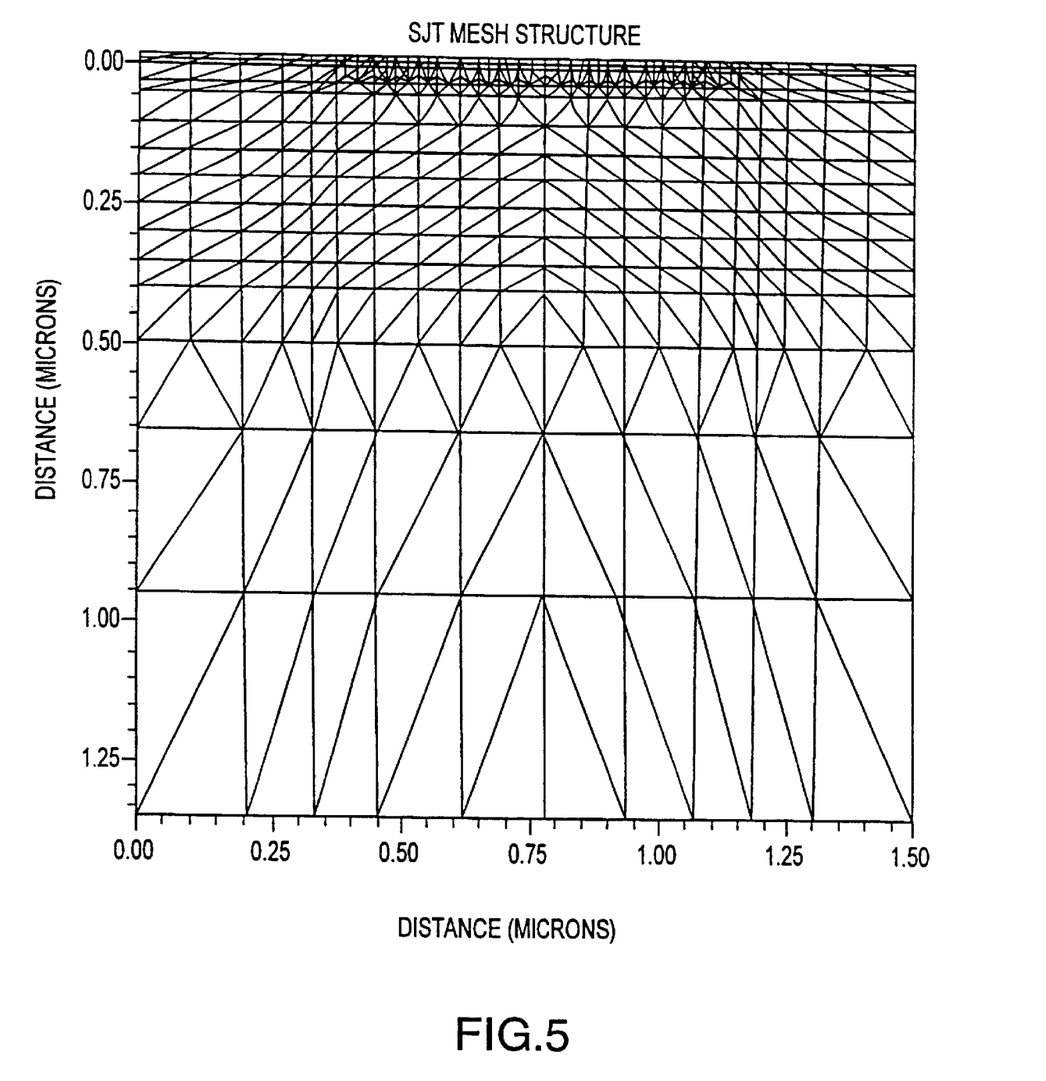
FIG. 5 is an exemplary computer generated SJT mesh structure modeling the electrical behavior of the SJT device.
Figure 6:
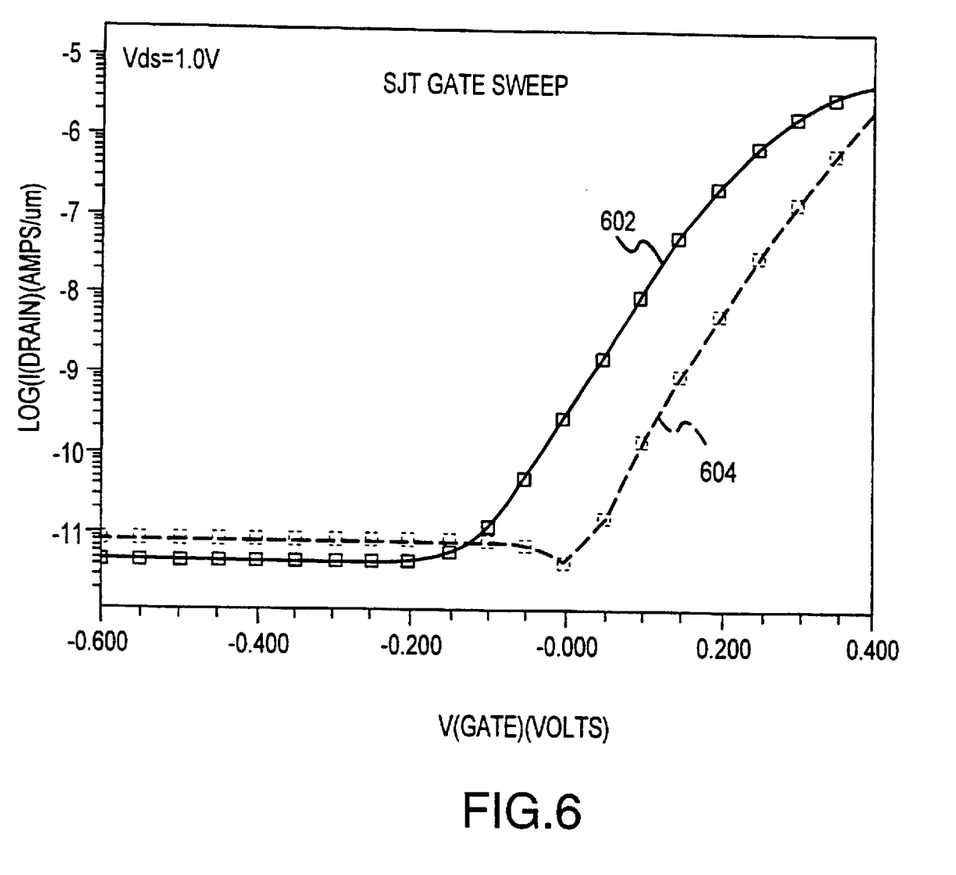
FIG. 6 is an exemplary plot of drain current and gate current as a function of gate voltage.
Figure 7:
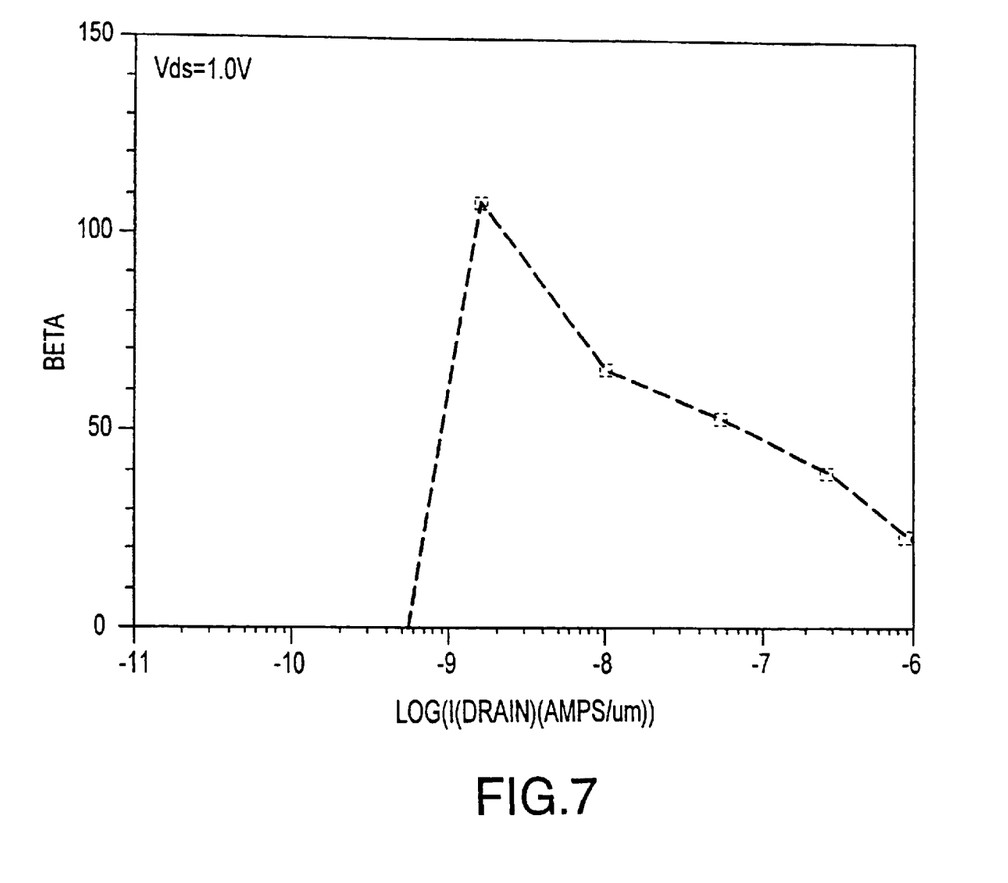
FIG. 7 is an exemplary plot of current gain as a function of drain current.

Operation of an exemplary SJT device 200 as shown in FIG. 4 was simulated as a two-dimensional computer model using MEDICI software tools (available from Avant! TCAD of Freemont California). The MEDICI software partitions the structure into a mesh on which it solves the relevant device equations as appropriate. An exemplary mesh is shown in FIG. 5 that may be used to calculate currents flowing in device 200. FIG. 6 shows exemplary gate currents 604 and drain currents 602 plotted as a function of voltage applied to the gate. For gate voltages in the range 0<$V_{gs}$<0.3, the drain current 602 shown is larger than the gate current 604, and both gate and drain currents increase exponentially with $V_{gs}$. An exemplary ratio of $I_d$ to $I_g$ (i.e. the current gain, $\beta$) is shown in FIG. 7 plotted as a function of drain current. As can be seen in the Figure, the exemplary current gain shown varies with $I_d$, and may be in the range 40–100 over almost 3 decades of drain current.

Figure 8:
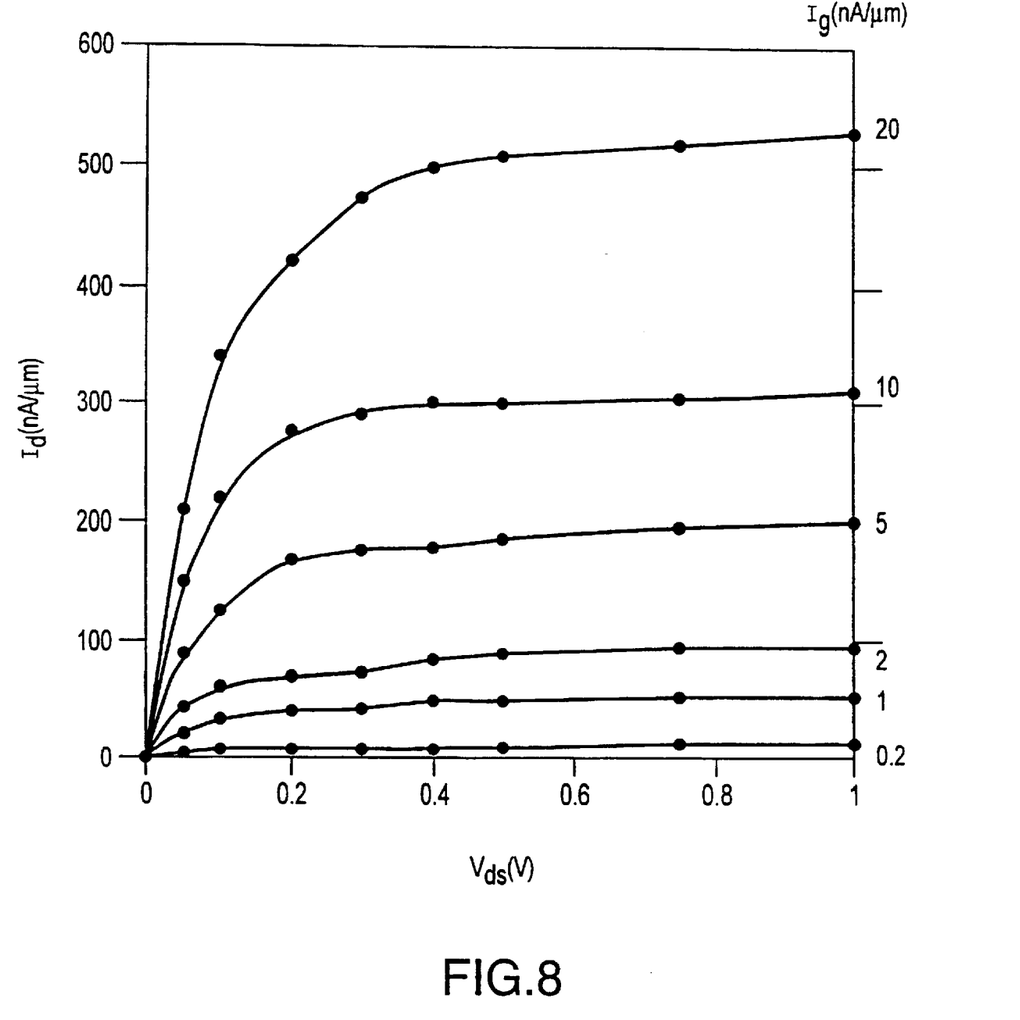
FIG. 8 is an exemplary plot of drain current versus drain voltage for different gate currents.

FIG. 8 shows the drain current of an exemplary SJT 200 as a function of drain voltage for different input bias currents applied to the gate, with data presented in units of nano-Amps (1nA=10$^{-9}$ Amperes) per micron of gate width. The graph shows good current saturation for high $V_{ds}$, which translates to a high output resistance as may be desired for many analog and digital circuit applications. It will be appreciated that in FIG. 8 a gate current is used to control which $I_d$-$V_{ds}$ trace is selected. This is in contrast to prior art MESFETs where a gate voltage is used to select the $I_d$-$V_{ds}$ trace.

Figure 9:
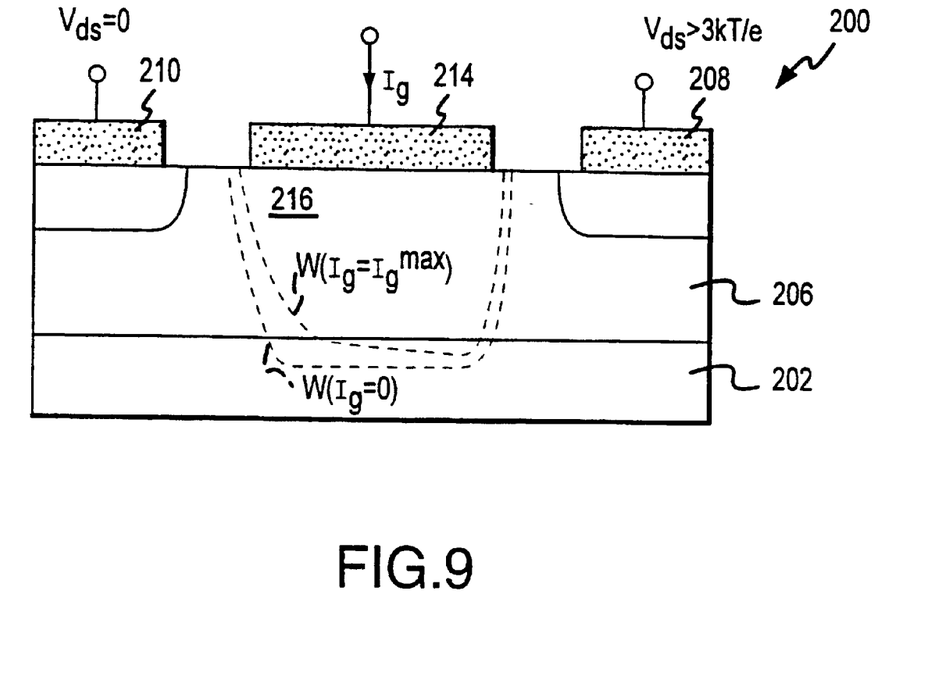
FIG. 9 is a schematic representation of an exemplary SJT showing the extent of the depletion region across the semiconducting channel.

The numeric simulations described above illustrate the important differences between a prior art enhancement mode MESFET and the Schottky Junction Transistor. FIG. 6 shows an exemplary embodiment in which drain current 602 flowing in the SJT varies exponentially with $V_{gs}$ over the entire useful range (or a substantial portion of the useful range) of the gate current 604. In such embodiments, the conducting channel of the SJT may be weakly accumulated under normal operating conditions. This is in contrast to prior art enhancement mode MESFETs for which the channel is designed to be in strong accumulation when the device is switched on. The SJT may be weakly accumulated when the thickness and doping concentration in the semiconducting channel have been chosen such that the depletion region extends across the bulk of the channel under normal operating conditions. The extent of the depletion region at the source end of the semiconducting channel in various embodiments may be calculated using equation 12 below.

$$W = \sqrt{\frac{2\varepsilon}{qN_D}(V_{bi} - V_{gs})} \quad (12)$$

where W is the width of the depletion region, $N_D$ represents a dopant concentration, $\varepsilon$ and q are constants, $V_{bi}$ is a built-in voltage between gate terminal 214 and semiconducting channel 206, and $V_{gs}$ is a voltage applied between gate terminal 214 and source terminal 210. From equations (8) and (9), the built-in voltage $V_{bi}$ for the exemplary embodiment described above may be calculated to be about 0.435 V. From equation (12) the depletion region at the source end of the channel for the exemplary embodiment used to derive this exemplary embodiment, may extend a distance of 75 nm, 65 nm, 55 nm, 49 nm and 42 nm for gate voltages of 0, 0.1, 0.2, 0.25 and 0.3 V respectively. The depletion region 216 at the source end of semiconducting channel 206 is shown to be only significantly smaller than the channel thickness of 50 nm for gate voltages $V_{gs}>0.3$ V. The extent of depletion region 216 across semiconducting channel 206 is shown schematically in FIG. 9. For the exemplary embodiment described above the normal operating range of the SJT may allow gate currents up to a maximum value, $I_g^{max}$, which for this exemplary embodiment may be approximately 1 $\mu A/\mu m$. Above this value the voltage developed on the gate may significantly exceed 0.3 V, depletion region 216 at the source end of the channel may be much less than 50 nm and semiconducting channel 206 may no longer be weakly accumulated. As a result the drain current may no longer vary exponentially with $(V_{gs}-V_{th})$ and the current gain may decrease rapidly with increasing $I_g$ until $\beta<1$ such that the gate current can no longer be used to control the drain current.

Complementary Devices

Circuit applications often require that complementary p- and n-channel devices be integrated on the same chip. Complementary versions of the SJT 200 may be integrated on a single substrate 202 by any technique, such as that disclosed in FIG. 10. With reference now to FIG. 10, an exemplary multi-SJT circuit 700 may by formed on a single substrate 202, which may be a part of an SOI wafer, or any other suitable wafer or substrate. In an exemplary embodiment, the starting substrate 202 may exhibit a low doping concentration (e.g. $N_A$, $N_D \leq$ about $10^{15}$ cm$^{-3}$). In one embodiment of an SJT circuit 700, for example, SOI substrate 200 may be doped n-type at the level $10^5$ cm$^{-3}$. The buried oxide thickness may be on the order of 0.2 microns to 1 micron (e.g. about 0.4 $\mu m$) and the surface silicon layer may be on the order of 0.05–0.5 microns (e.g about 0.12 $\mu m$) thick Channels 206 for the various devices (such as channels 206A and 206B in FIG. 10) may be isolated by mesa etching, ion beam induced damage, or any other technique. The n-type dopants for the n-channel device 200A may be introduced by ion implantation or any other suitable technique, as are the p-type dopants for the p-channel device 200B (FIG. 10(d)). In an exemplary embodiment, n-channels 206A may be formed by implanting phosphorous at an energy of about 25 keV to a dose of about $3.5 \times 10^{11}$ cm$^{-2}$. P-channels 206B may be formed by implanting boron at an energy of about 10 keV to a dose of about $2.8 \times 10^{11}$ cm$^{-2}$. Of course dopants, implants, energy levels and doses described herein are for illustrative purposes only, and actual implementations may vary widely from embodiment to embodiment.

Figure 10A:
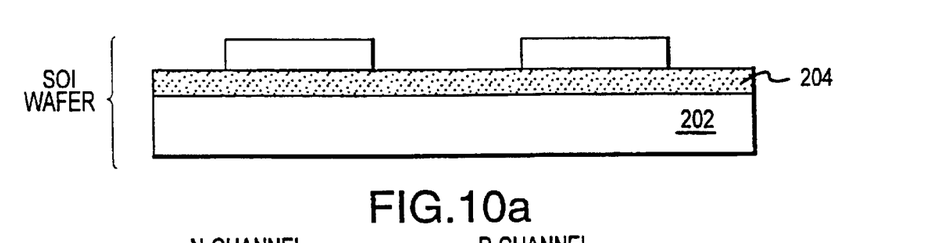
FIGS. 10a–10c is a schematic representation of an exemplary process flow that may be used to fabricate complementary n- and p-channel SJTs on the same substrate.
Figure 10B:
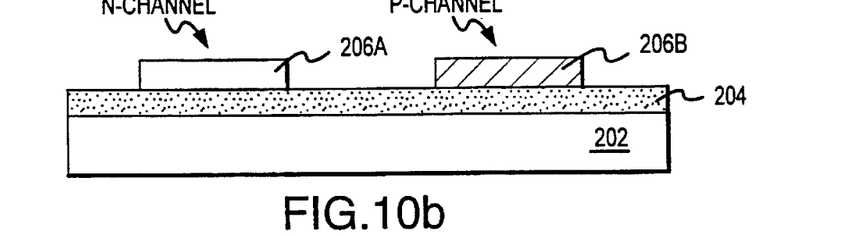
Figure 10C:
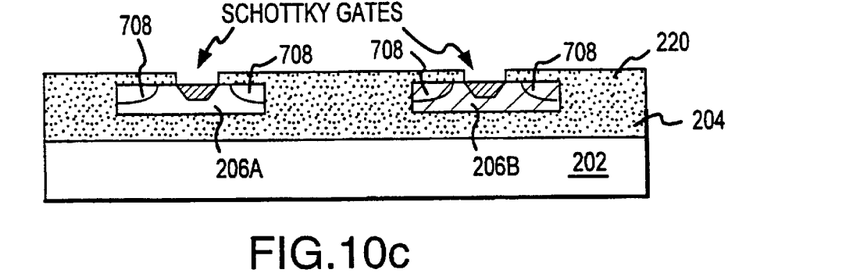
Figure 10D:
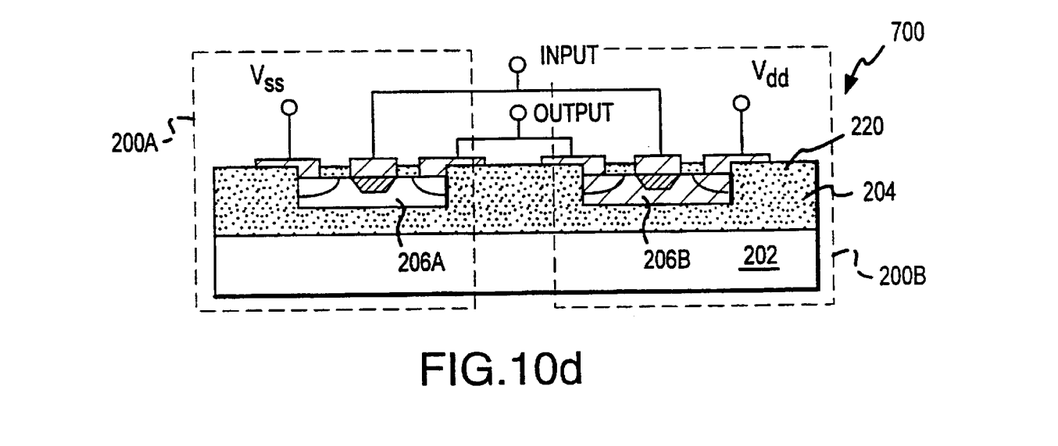

An optional oxide or other insulator 220 may be formed on the surface of semiconducting layer 206 and on insulating layer 204 (for example, as shown in FIG. 10(c)) by thermal oxidation of the silicon, by deposition, or by any other suitable technique. If thermal oxidation is used, some of channel 206 may be consumed, and the thickness of channel 206 will be less than that of the original silicon on the surface of SOI layer 722. As may be appropriate, the channel thickness used to calculate device operation may be the final thickness after oxidation.

Source and drain contacts 708 to the n-channel devices may be formed by opening windows in the insulating layer 220 above the n-channel devices 200A and implanting a relatively heavy dose of arsenic (or any other suitable material) into the exposed silicon (FIG. 10(c)). Likewise, the source and drain contacts 708 to the p-channel devices 200B may be formed by opening windows in the insulating layer 220 above the p-channel devices and implanting a relatively high dose of boron into the exposed silicon. The source and drain implants may be activated by a high temperature anneal (on the order of about 800–1000 degrees for about 1–60 minutes), or through any other suitable technique. In an exemplary embodiment, the implanted channels may be suitably annealed at 950° C. for 45 minutes, or otherwise processed to completion.

A window may also be opened in insulator 220 (FIG. 10(c)) to expose the underlying silicon in those regions where Schottky gates 214 are to be formed. The gate metal (such as cobalt di-silicide or another metal) may then be deposited and, if necessary, annealed to form the Schottky barrier. A single gate metal may be used to form the Schottky gate to both the n-channel and p-channel devices. In various embodiments, however, the properties of the n- and p-channel devices 200 can be tailored somewhat differently if a different Schottky material is used for each. Devices may then wired together to form the circuit by depositing a highly conducting interconnnect layer such as aluminum, copper, gold, or the like. Further windows in insulating layer 220 may be made to accommodate interconnections between devices, as appropriate.

Exemplary complementary n- and p-channel devices of the type described in this disclosure have been simulated based on the process flow described above. For this experiment, the processing of the devices was simulated using the Avant! TCAD package TSUPREME-4. After process simulation the electrical characteristics of n- and p-channel devices with exemplary 0.5 $\mu m$ gate lengths were simulated using MEDICI. Although the results of the simulation are presented, for example, in FIGS. 11–12 for illustrative purposes, it will be understood that results obtained from the many embodiments of the invention may vary widely from those presented here. For example, many different parameters for device dimensions, dopants, dopant concentrations, and the like will suitably create performance characteristics that vary dramatically from embodiment to embodiment.

Figure 11:
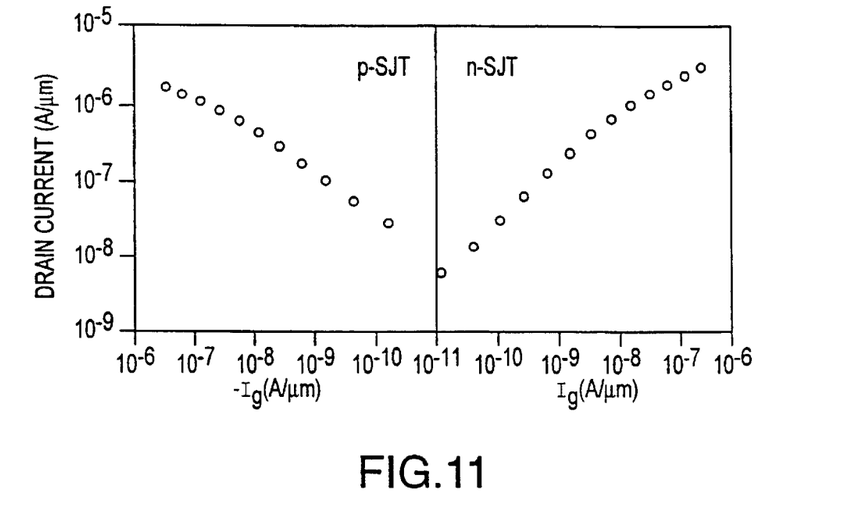
FIG. 11 is an exemplary plot of drain current against gate current for complementary n- and p-channel SJTs.

FIG. 11 shows the output drain current resulting from an exemplary simulation as a function of the input gate current for the two devices. The figure shows results from an exemplary n-channel device 200A with a drain bias $V_{ds}=1.0$ V applied and results from an exemplary p-channel device with $V_{ds}=-1.0$ V applied. For the n-channel device the gate current and drain currents are both positive while for the p-channel device they are both negative. FIG. 11 shows the magnitudes of these exemplary currents, and shows that over a wide range of gate current bias the two devices are complementary (i.e. the drain current in the p-channel device is equal in magnitude, but opposite in sign to an n-channel device of the same dimensions if the input gate current is also equal in magnitude but opposite in sign). The device processing conditions (e.g. channel implant energies, doses and anneal times etc.) may be chosen to give the highest complementarity for gate bias magnitudes in the range $10^{-10}$ to $10^{-9}$ A. Different complementarity at higher or lower current ranges can be achieved by modifying the processing conditions, primarily by varying the channel doping and/or thickness to change the gain as taught by equation (2).

The cut-off frequency of a field effect transistor is generally given by $f_T = g_m/2\pi C_g$, and transconductance $g_m = dI_d/dV_{gs}$ can be shown from equation (1) to be $g_m = I_d/U_T$. The total gate capacitance, $C_g$, of the device described by the current invention can be simulated using MEDICI.

Figure 12:
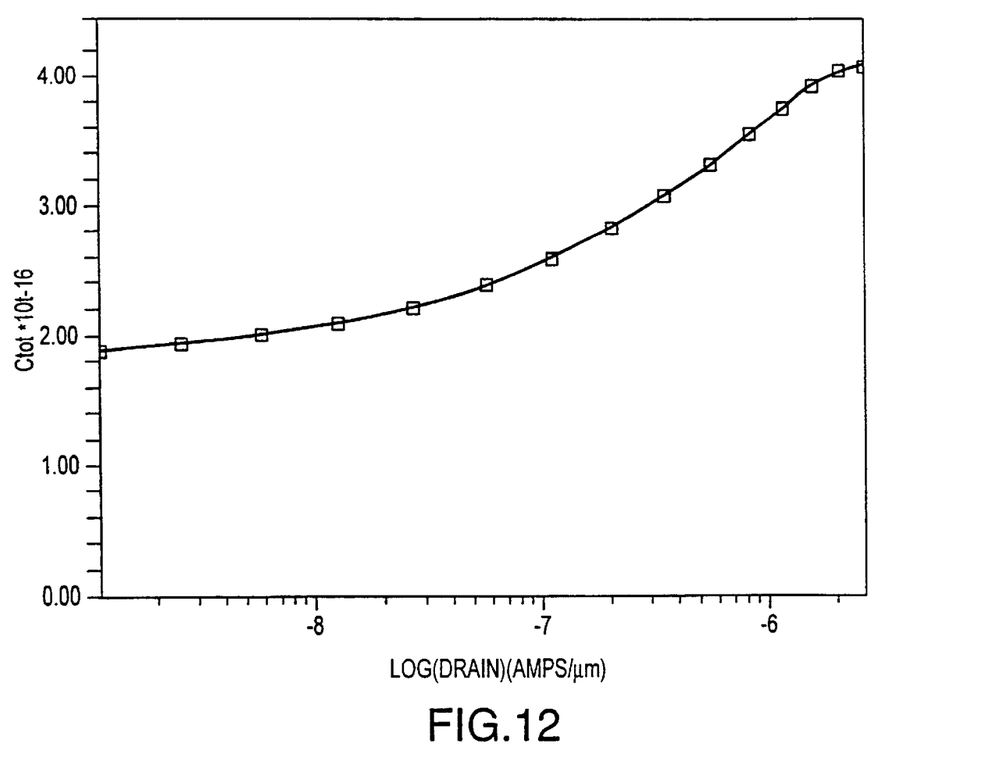
FIG. 12 is an exemplary plot of the gate capacitance of an n-channel SJT as a function of drain current.

An exemplary plot of input (i.e. gate) capacitance for a 0.5 $\mu$m gate length n-channel device with an ion-implanted channel (implanted with phosphorus at an energy E=25 keV to a dose of $3.5 \times 10^{11}$ cm$^{-2}$) of thickness a=0.12 $\mu$m is shown in FIG. 12. For this particular exemplary embodiment, the post-implant anneal was assumed to be at 950° C. for 45 minutes, the gate length is assumed to be 0.5 $\mu$m and the drain bias assumed to be 1.0 V, although of course various other parameters could be used. As can be readily discerned from FIG. 12, the total capacitance of this exemplary SJT device may be orders of magnitude smaller than an equivalent bipolar junction transistor because of the absence of the minority charge diffusion capacitance. As a result, the SJT modeled may operate in the micropower regime at much higher frequencies than a comparable BJT. Moreover, shorter gate lengths may be enabled, thus allowing increased operating frequencies compared to prior art weakly inverted CMOS circuits. With continued reference to FIG. 12, the input capacitance at a drain bias of about 1 $\mu$A/$\mu$m may be about $3.5 \times 10^{-16}$ F/$\mu$m, which may correspond to a cut-off frequency of about 18 GHz. The gate capacitance of the new device may also be smaller than a prior art MOSFET of the same dimensions. The input capacitance of a conventional MOSFET is generally governed by the so-called oxide capacitance, $C_{ox}$, and for a strongly inverted MOSFET with a 2 nm gate oxide and $L_g$=0.5 $\mu$m, oxide capacitance $C_{ox}$ is about $80 \times 10^{-16}$ F/$\mu$m. As a result, various embodiments of SJTs may have cut-off frequencies approximately 20 times faster than prior art MOSFETs of the same dimensions carrying the same current.

It will be appreciated that the SJT may be in the regime of weak accumulation (e.g. with a bias voltage less than the threshold voltage $V_{th}$), which may be considered to be in some ways analogous to the case of weak inversion for the MOSFET. If the input gate current of the SJT is increased beyond a certain value (corresponding to $V_{th}$) the device may move into the strong accumulation regime and equation (2) may no longer be valid. The ratio of $I_d$ to $I_g$ will decrease as $I_g$ increases and at some point $I_g$ will be larger than $I_d$. When this occurs, performance of the SJT may be comparable to that of an enhancement mode MESFET with $V_{gs} > V_{th}$ and a heavily leaking gate. Various embodiments of the SJT may therefore be considered as an enhancement mode MESFETs operating below threshold (i.e. $V_{gs} < V_{th}$). In this regime both the gate current and drain current may vary exponentially with $V_{gs}$. If the SJT is designed in such a way that $I_g < I_d$, however, the current gain may remain greater than unity in the weak accumulation (i.e. sub-threshold) mode. This may be accomplished, for example, by designing the active layer to have a threshold voltage similar to the turn on voltage of the Schottky gate, which may vary with the materials used but may be on the order of about 0.3 V. The gate bias current may then be limited to those values such that $0 < V_{gs} < V_{th} \approx 0.3$ V. This method of operation may be compared in some ways to operating a BJT below the turn-on voltage of the base-emitter junction (which is typically 0.7 V) but without the disadvantages associated with minority carriers.

The corresponding structures, materials, acts and equivalents of all elements in the claims below are intended to include any structure, material or acts for performing the functions in combination with other claimed elements as specifically claimed. The scope of the invention should be determined by the appended claims and their legal equivalents, rather than by the examples given above. Unless specifically stated herein, no element recited in the specification is essential to the practice of the invention. Any steps recited in any method claims may be executed in any order, including an order apart from which they are presented in the claims below.

What is claimed is:

1. A method of producing an output current in a device comprising a source terminal, a gate terminal and a drain terminal formed on a semiconducting channel, wherein said semiconducting channel comprises a depletion region between said source terminal and said drain terminal, wherein the method comprises the steps of:

providing a bias voltage to said gate terminal such that said depletion region allows current to flow in said semiconducting channel, wherein said bias voltage is less than a threshold voltage for said device such that said device operates in a sub-threshold mode; and controlling a gate current flowing into said channel from said gate terminal to adjust said depletion region and to thereby produce said output current at said drain terminal as a function of said gate current, wherein said input current and said output current both vary substantially exponentially with a gate-source voltage in said sub-threshold mode, and wherein said drain current varies substantially linearly with said gate current through a substantially constant current gain that is given by a ratio of said drain current to said gate current.

2. The method of claim 1 wherein said input current varies substantially exponentially with a gate-source voltage in said sub-threshold mode.

3. The method of claim 1 wherein said input current varies substantially exponentially with a gate-source voltage in said sub-threshold mode.

4. The method of claim 1 wherein said device is a MESFET.

5. The method of claim 1 wherein said gate terminal comprises a Schottky barrier.

6. The method of claim 5 wherein said output current varies substantially exponentially with a gate-source voltage in said sub-threshold mode.

7. The method of claim 5 wherein said input current varies substantially exponentially with a gate-source voltage in said sub-threshold mode.

8. The method of claim 6 wherein said input current varies substantially exponentially with a gate-source voltage in said sub-threshold mode.

9. The method of claim 1 wherein said source and drain terminals comprise an ohmic contact.

10. The method of claim 1 further comprising the step of forming said depletion region such that said depletion region substantially extends across said semiconducting channel.

11. The method of claim 5 further comprising the step of forming said depletion region such that said depletion region substantially extends across said semiconducting channel.

12. The method of claim 11 wherein said depletion region is configured according to:

$$W = \sqrt{\frac{2\varepsilon}{qN_D}(V_{bi} - V_{gs})}$$

wherein W is the width of said depletion region, $N_D$ represents a dopant concentration, $\varepsilon$ and q are constants, $V_{bi}$ is a built-in voltage between said gate terminal and said semiconducting channel, and $V_{gs}$ is a voltage applied between said gate terminal and said source terminal.

13. The method of claim 5 wherein said forward bias voltage places said device in a weak accumulation regime.

14. The method of claim 5 wherein said forward bias voltage places said device in a weak depletion regime.

15. The method of claim 1 wherein both said gate current and said output current are primarily produced by majority carriers.

* * * * *